United States Patent
Kong et al.

(10) Patent No.: US 12,463,651 B2
(45) Date of Patent: Nov. 4, 2025

(54) MIXER SECOND-ORDER INPUT-INTERCEPT POINT TEMPERATURE COMPENSATION

(71) Applicant: Apple Inc., Cupertino, CA (US)

(72) Inventors: Long Kong, Campbell, CA (US); Shinan Lu, Foster City, CA (US); Utku Seckin, San Jose, CA (US)

(73) Assignee: Apple Inc., Cupertino, CA (US)

( * ) Notice: Subject to any disclaimer, the term of this patent is extended or adjusted under 35 U.S.C. 154(b) by 191 days.

(21) Appl. No.: 18/460,259

(22) Filed: Sep. 1, 2023

(65) Prior Publication Data

US 2025/0080126 A1    Mar. 6, 2025

(51) Int. Cl.
| | | |
|---|---|---|
| H03M 1/06 | (2006.01) | |
| G06F 17/14 | (2006.01) | |
| H03M 1/08 | (2006.01) | |

(52) U.S. Cl.
CPC ........ *H03M 1/0609* (2013.01); *G06F 17/142* (2013.01); *H03M 1/0845* (2013.01)

(58) Field of Classification Search
CPC ........ H03M 1/06; H03M 1/0609; H03M 1/08; H03M 1/0845
See application file for complete search history.

(56) References Cited

U.S. PATENT DOCUMENTS

| | | | |
|---|---|---|---|
| 6,124,818 A * | 9/2000 | Thomas | H03M 1/164 341/161 |
| 7,027,792 B1 | 4/2006 | Luff et al. | |
| 7,742,747 B2 | 6/2010 | Manku et al. | |
| 7,952,408 B2 | 5/2011 | Eisenstadt et al. | |
| 8,050,649 B2 | 11/2011 | Chen | |
| 8,390,489 B2 * | 3/2013 | Sun | H03M 1/1014 341/120 |
| 8,766,835 B2 * | 7/2014 | Hojabri | H03M 3/458 341/143 |

(Continued)

FOREIGN PATENT DOCUMENTS

JP        4636138 B2      2/2011

OTHER PUBLICATIONS

Subhan Saqib et al.; "A 100-800 MHz 8-path Polyphase Transmitter With mixer Duty-Cycle Control Achieving $<-$40 dBc for All Harmo"; IEEE Journal of Solid-State Circuits, vol. 49, No. 3, Mar. 31, 2014; pp. 595-607 (XP011541958).

(Continued)

*Primary Examiner* — Lam T Mai
(74) *Attorney, Agent, or Firm* — FLETCHER YODER PC

(57) ABSTRACT

The present disclosure relates to compensating for temperature variation of a mixer. Embodiments herein may include performing a single-point Fast Fourier Transform (FFT) (or complex downconversion with DC average) for a number of samples to obtain a transform for each of the number of samples, phase aligning a set of phases associated with each transform, and averaging each transform to generate an analog-to-digital converter (ADC) power value. Further, the disclosed embodiments may include generating a compensation value based on the analog-to-digital converter power value and applying the compensation value to the calibration circuit of the mixer to compensate for a second-order intermodulation product.

20 Claims, 5 Drawing Sheets

(56) References Cited

U.S. PATENT DOCUMENTS

| | | | |
|---|---|---|---|
| 8,823,563 B1* | 9/2014 | Ransun | H03M 1/0607 |
| | | | 341/120 |
| 9,020,458 B2 | 4/2015 | Goldblatt | |
| 9,184,857 B2 | 11/2015 | Vassiliou | |
| 9,425,811 B1* | 8/2016 | Mandal | H03M 1/0607 |
| 9,455,737 B1* | 9/2016 | Rajaee | H03M 3/464 |
| 9,729,254 B1 | 8/2017 | Zhou et al. | |
| 9,806,745 B2* | 10/2017 | Weng | H04B 1/0475 |
| 9,813,169 B2 | 11/2017 | Einzinger | |
| 10,122,568 B2* | 11/2018 | Shafiee | H04L 27/22 |
| 10,298,248 B1* | 5/2019 | Vaz | H03M 1/12 |
| 10,530,379 B1* | 1/2020 | Vaz | H03M 1/1215 |
| 10,594,270 B1* | 3/2020 | Seckin | H03F 3/45192 |
| 10,615,435 B2 | 4/2020 | Eichberger et al. | |
| 10,700,641 B1* | 6/2020 | Chan | H04B 1/30 |
| 10,756,744 B1* | 8/2020 | Seckin | H03M 1/68 |
| 10,797,916 B2 | 10/2020 | Kyles et al. | |
| 11,038,544 B2 | 6/2021 | Mishra et al. | |
| 11,095,252 B1* | 8/2021 | Zhao | H04B 15/005 |
| 11,374,588 B1* | 6/2022 | Mo | H03M 1/0612 |
| 11,669,207 B2* | 6/2023 | Maharyta | G06F 3/0418 |
| | | | 345/174 |
| 11,695,602 B2* | 7/2023 | Balakrishnan | H04L 27/14 |
| | | | 375/350 |
| 11,843,413 B1* | 12/2023 | Kong | H04B 1/7172 |
| 2003/0132867 A1* | 7/2003 | Ostrom | H03M 1/109 |
| | | | 341/120 |
| 2006/0068746 A1 | 3/2006 | Feng et al. | |
| 2007/0132617 A1* | 6/2007 | Le | H03M 1/1014 |
| | | | 341/120 |
| 2010/0253398 A1* | 10/2010 | Seckin | H03K 23/667 |
| | | | 327/117 |
| 2013/0288612 A1* | 10/2013 | Afsahi | H03F 1/223 |
| | | | 455/73 |
| 2015/0002321 A1* | 1/2015 | Zhou | H03M 1/0617 |
| | | | 341/118 |
| 2015/0044979 A1* | 2/2015 | Seckin | H04B 1/0475 |
| | | | 455/114.2 |
| 2016/0211861 A1* | 7/2016 | Op 't Eynde | H03M 1/1038 |
| 2017/0214411 A1* | 7/2017 | Liu | H03M 1/1009 |
| 2018/0241409 A1* | 8/2018 | Dagher | H03M 3/396 |
| 2020/0052708 A1* | 2/2020 | Seckin | H03L 7/18 |
| 2021/0064380 A1* | 3/2021 | Mai | H03H 17/06 |
| 2021/0067107 A1* | 3/2021 | Seckin | H03F 3/2175 |
| 2021/0096217 A1* | 4/2021 | Jadidian | G01S 13/30 |
| 2022/0123976 A1 | 4/2022 | Mangal | |
| 2022/0149854 A1* | 5/2022 | Menkus | H03M 1/0678 |
| 2022/0173947 A1* | 6/2022 | Balakrishnan | H03D 7/165 |
| 2023/0170859 A1 | 6/2023 | Singhai | |
| 2023/0378988 A1* | 11/2023 | Zhang | H04B 1/18 |

OTHER PUBLICATIONS

Barra D. et al.; "A Low-Power Baseband ASIC for an Energy-Collection IR-UWB Receiver", IEEE Journal of Solid State Circuits, vol. 44, No. 6, Jun. 30, 2009, pp. 1721-1733 (XP011258520).

William W. Si et al.; "A1.9-GHz Single-Chip CMOS PHS Cellphone", IEEE Journal of Solid-State Circuits, vol. 41, No. 12, pp. 2737-2745 (XP011150741).

Kim Jusung et al.; "Low-Power, Low-Cost CMOS Direct-Conversion Receiver Frant-End for Multistandard Applications", IEEE Journal of Solid-State Circuits, vol. 48, No. 9, Sep. 30, 2013; pp. 2090-2103 (XP011524486).

Extended European Search Report for European Patent Application No. 24195203.5 dated Feb. 17, 2025; 12 pgs.

* cited by examiner

MIXER SECOND-ORDER INPUT-INTERCEPT POINT TEMPERATURE COMPENSATION

BACKGROUND

The present disclosure relates generally to a mixer of a transceiver, and more specifically to compensating for temperature variation at the mixer.

A mixer of a transceiver may include multiple transistors (e.g., acting as switches). Each of the multiple transistors may be coupled to an impedance. For example, each transistor may receive a positive or negative in-phase or quadrature component of a local oscillation signal. However, due to real-world (e.g., manufacturing and/or process) variations between the transistors, switching threshold voltages of the transistors may be mismatched, resulting in second-order nonlinearity in the mixer. While a compensation value for mismatched transistors may be calibrated using a calibration circuit (e.g., including a resistor ladder coupled to a transistor), the threshold voltages, as well as bias voltages, of the transistors may vary with temperature. Further, the mixer may experience a rapid decline in performance across temperatures. As such, it may be desired to reduce a second-order intercept point (IIP2) variation resulting from operation of the mixer across temperatures.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device includes a receiver including a mixer and an analog-to-digital converter (ADC), the mixer including a calibration circuit. Further, the electronic device includes one or more processors coupled to the receiver, the one or more processors configured to receive a first set of ADC power samples from the ADC and perform a first transform on the first set of ADC power samples associated with a first set of phases. The one or more processors may also be configured to receive a second set of ADC power samples from the ADC, perform a second transform on the second set of ADC power samples, and apply a compensation value based on the first transform and the second transform to a calibration circuit of the mixer to compensate for a second-order intermodulation product.

In another embodiment, a method includes receiving, via processing circuitry, a set of analog-to-digital converter samples at a mixer, receiving, via the processing circuitry, a set of phases associated with the set of ADC power samples, and receiving, via the processing circuitry, a closest phasor based on a subharmonic of an ADC clock and the set of phases. The method also includes generating, via the processing circuitry, a compensation value based on the set of ADC power samples and the closest phasor, and applying, via the processing circuitry, the compensation value to a calibration circuit of the mixer.

In yet another embodiment, one or more non-transitory, tangible, computer-readable media that store instructions configured to cause a processor to receive a beat frequency of a second-order intermodulation product, receive a subharmonic of an analog-to-digital converter (ADC) clock that corresponds to the beat frequency. Further, the instructions cause the processor to receive a first set of ADC power samples, perform a first transform on the first set of ADC power samples, receive a first set of phases associated with the first set of ADC power samples, receive a second set of ADC power samples, perform a second transform on the second set of ADC power samples, and receive a second set of phases associated with the second set of ADC samples. The instructions also cause the processor to rotate the second transform to align the second set of phases and the first set of phases and generate an ADC power value based on the first transform and the second transform as rotated.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
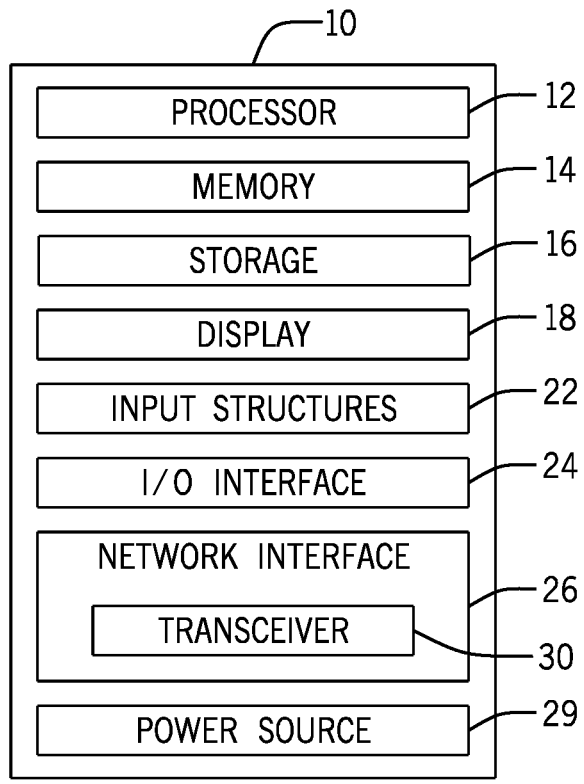
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

This disclosure is directed to a mixer of a transceiver of an electronic device, and more specifically to compensating for temperature variation of the mixer. In the transceiver, the mixer plays a role in enabling transmission and reception in radiofrequency (RF) signals by converting the frequency of incoming signals to a different frequency to facilitate various signal processing operations. However, switching threshold voltages of one or more transistors of the mixer may be mismatched due to variations between the one or more transistors. Thus, second-order nonlinearity may result in the mixer, which may affect performance of the mixer. Further, as a solution, a compensation value may be calibrated for the mismatched one or more transistors using a calibration circuit. However, the solution may be insufficient due to changing temperatures resulting in varying threshold voltages and bias voltages. As such, it may be desired to generate a reference voltage that tracks or varies with a common mode voltage and/or a threshold voltage of the one or more transistors of the mixer.

Embodiments herein may include a replica mixer circuit and a temperature compensation circuit. The replica mixer circuit may generate or facilitate generating a reference voltage that tracks (e.g., varies with, varies directly with) the common mode voltage and/or the threshold voltage of a replica mixer (e.g., a replica of a transistor of the mixer). The reference voltage may then be applied to the resistor ladder to adjust the threshold and/or bias voltages to compensate for temperature variations. In particular, a gate of the replica mixer may be coupled to an output of a first voltage buffer in a feedback loop such that a source voltage of the replica mixer equals a common mode voltage of the mixer output, and a gate or gate-to-source voltage of the replica mixer is equal to a sum of the common mode voltage, a threshold voltage of the replica mixer, and an overdrive or offset voltage. A gate of the replica mixer may be coupled to an input terminal (e.g., a negative terminal) of a second voltage buffer, which outputs the reference voltage.

The temperature compensation circuit may generate a temperature coefficient that may be applied to a current ($I_{out}$) going through the calibration circuit to facilitate compensating for temperature variation. The temperature compensation circuit may include a transistor whose gate and drain are coupled to a gate of the transistor of the calibration circuit at a node, and include three current sources (a bias current source ($I_b$), an up current source ($I_{up}$), and a down current source ($I_{dn}$)) coupled to the node. It should be noted that the current in the calibration circuit may be expressed as the bias current source summed with the up current source minus the down current source ($I_b+I_{up}-I_{dn}$). The up current source and the down current source may be set to a proportional to absolute temperature (PTAT) current source ($I_{ptat}$) and an inversely proportional to absolute temperature (NTAT) current source ($I_{ntat}$), or a constant current source ($I_{const}$), respectively. This may enable the temperature compensation circuit to track temperature, thus compensating for temperature variation.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer, a portable electronic or handheld electronic device such as a wireless electronic device or smartphone, a tablet, a wearable electronic device, and other similar devices. In additional or alternative embodiments, the electronic device 10 may include an access point, such as a base station, a router (e.g., a wireless or Wi-Fi router), a hub, a switch, and so on. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system)

encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a 3rd generation (3G) cellular network, universal mobile telecommunication system (UMTS), 4th generation (4G) cellular network, Long Term Evolution® (LTE) cellular network, Long Term Evolution License Assisted Access (LTE-LAA) cellular network, 5th generation (5G) cellular network, and/or New Radio (NR) cellular network, a 6th generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mmWave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
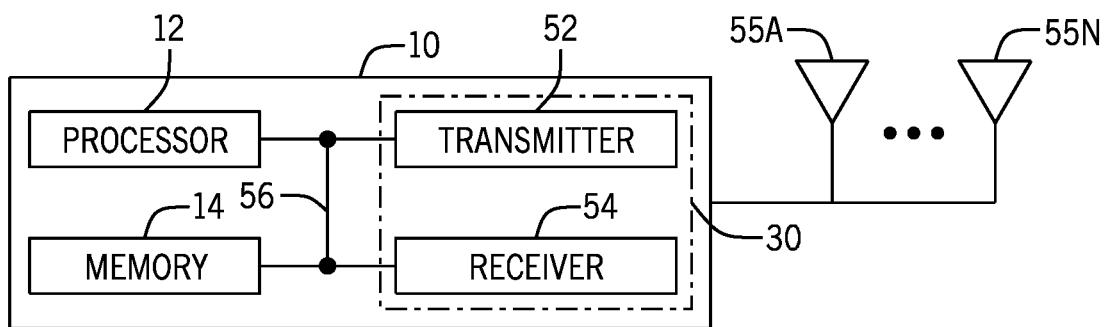
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
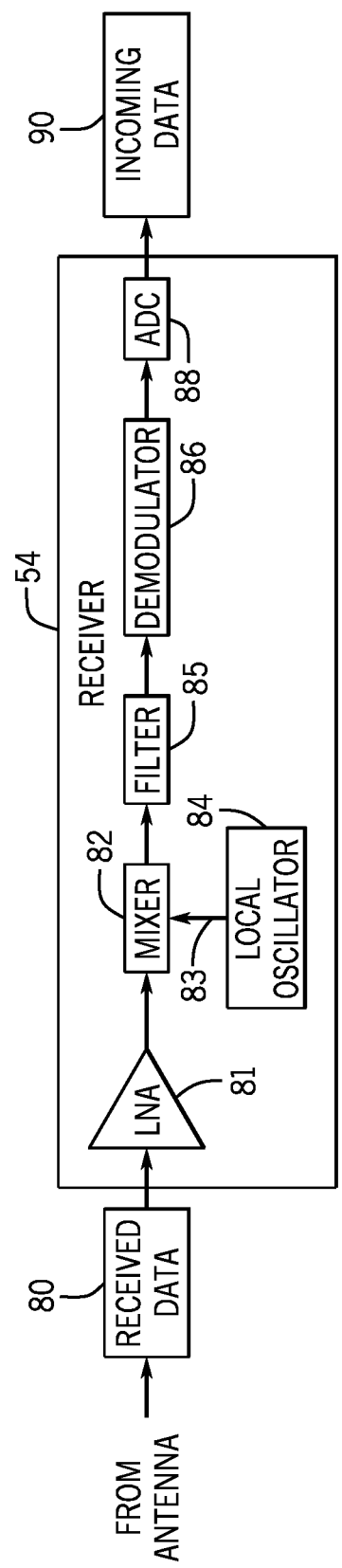
FIG. 3 is a schematic diagram of a receiver of the electronic device of FIG. 1, according to embodiments of the present disclosure.

FIG. 3 is a schematic diagram of a receiver 54 (e.g., receive circuitry) that may be part of the transceiver 30, according to embodiments of the present disclosure. As illustrated, the receiver 54 may receive received data 80 from the one or more antennas 55 in the form of an analog signal. A low noise amplifier (LNA) 81 may amplify the received analog signal to a suitable level for the receiver 54 to process. A mixer 82 may combine the amplified signal with a local oscillation signal 83 from a local oscillator 84 to generate an intermediate or baseband frequency signal, which may include a high frequency component and a low frequency component. A filter 85 (e.g., filter circuitry and/or software) may remove undesired noise from the signal, such as cross-channel interference. The filter 85 may also remove additional signals received by the one or more antennas 55 that are at frequencies other than the desired signal. The filter 85 may include any suitable filter or filters to remove the undesired noise or signals from the received signal, such as a bandpass filter, a bandstop filter, a low pass filter, a high pass filter, and/or a decimation filter. The filter 85 may filter the high frequency component and pass through the low frequency component. The low frequency component may include noise, such as nonlinear beat noise, which may be referred to as a beat component.

A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include an additional mixer and/or a digital down converter (e.g., for converting an input signal from an intermediate frequency to a baseband frequency).

Figure 4:
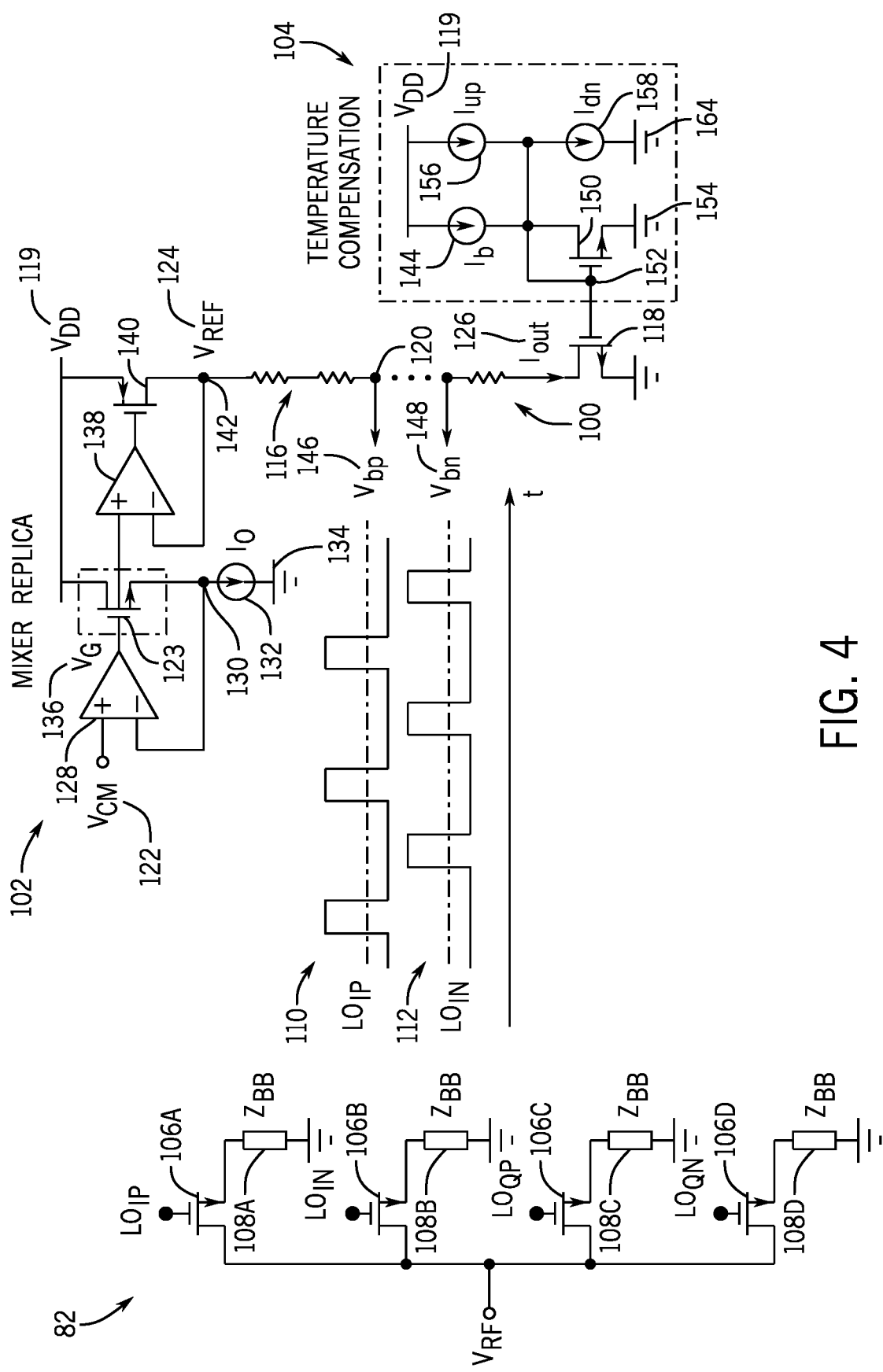
FIG. 4 is a circuit diagram of a mixer with a calibration circuit, a replica mixer, and a temperature compensation circuit, according to embodiments of the present disclosure.

FIG. 4 includes a circuit diagram of the mixer 82 of FIG. 3 with a calibration circuit 100, a replica mixer circuit 102, and a temperature compensation circuit 104, according to embodiments of the present disclosure. As illustrated, the mixer 82 may include one or more transistors 106A, 106B, 106C. 106D (collectively referred to herein as transistors 106 for convenience). Each of the transistors 106 may be coupled to an impedance 108A, 108B, 108C, and 108D (collectively referred to herein as impedance 108 for convenience). Further, each of the transistors 106 may receive a positive or a negative in-phase or quadrature component of a local oscillation signal. In particular, local oscillators 84 may generate multiple local oscillator signals 83 each phase-shifted in relation to one another to generate the in-phase and quadrature components. The local oscillator signals 83 may be toggled between zero Volts (by turning off the local oscillator signal 83) and a power supply voltage 119 (VDD) (by turning on the local oscillator signal 83). The power supply voltage 119 may be a voltage supplied by a power supply, such as the power source 29. Based at least on the local oscillator signals 83, the mixer 82 may operate to upconvert or downconvert frequency of an input radio frequency signal to facilitate subsequent processing.

For example, the transistor 106A may correspond to the positive in-phase component of the local oscillation signal, the transistor 106B may correspond to the negative in-phase component of the local oscillation signal, the transistor 106C may correspond to the positive quadrature component, and the transistor 106D may correspond to the negative quadrature component. Combining the positive and negative in-phase and quadrature components may create a set of signals that span a 360-degree phase range, which may enable the mixer 82 to extract desired frequency components from an input signal.

A threshold voltage of a transistor 106 may include a voltage level at which the transistor 106 switches. A threshold mismatch may occur when the transistors 106 activate at different or unequal voltage levels. The threshold mismatch may result in second-order nonlinearity in the mixer 82. However, the calibration circuit 100 (e.g., including a resistor ladder 116 coupled to a transistor 118) may determine a bias voltage 120 to apply to calibrate the threshold mismatch and reduce second-order nonlinearity. The calibration circuit 100 may be coupled to the mixer 82 and may enable compensation for the threshold mismatch by adjusting circuit parameters to achieve improved linearity.

With the foregoing in mind, FIG. 4 illustrates an example of a positive in-phase component 110 generated by the transistor 106A and a negative in-phase component 112 generated by the transistor 106B. As shown in FIG. 4, threshold mismatch may be present between the positive in-phase component 110 and the negative in-phase component 112. As an example, the first transistor 106A may have a threshold voltage of 100 millivolts and the second transistor 106B may have a threshold voltage of 110 millivolts. Thus, the calibration circuit 100 may determine the bias voltage 120 is 10 millivolts (e.g., the difference between the threshold voltages of the first transistor 106A and the second transistor 106B) and adjust the bias voltage 120 applied to the mixer 82 to reduce or minimize the threshold mismatch amongst the transistors 106 (e.g., 106A, 106B). It should be noted that the positive in-phase component 110 and the negative in-phase component 112 are only used as examples, and the same techniques may be applied to the positive quadrature component and/or the negative quadrature component shown in FIG. 4.

However, the threshold mismatch and the bias voltage 120 may fluctuate at varying temperatures. For example, the threshold mismatch may increase at cold temperatures and decrease at hot temperatures. Further, an on-resistance of a transistor 106 (Ron) may determine an out-of-band blocker gain at its input, which may lead to a different power of a second-order intermodulation (IM2) product, and thus, the corresponding low frequency component passed through the filter 85. Temperature changes may also cause a variation in the on-resistance of the transistor 106. Post-calibration of a second-order input intercept point (IIP2) variation of the mixer 82 may vary with the on-resistance of the transistor 106, where the local oscillation signal 83 has a duty cycle of alpha (a). As an example, Equation 1 is shown below, where un is electron mobility and Cox is oxide capacitance per unit area:

$$R_{on} = \frac{1}{\mu_n C_{ox} \frac{W}{L}((1-\alpha)V_{DD} + V_b - V_{CM} - V_{th})} \quad \text{(Equation 1)}$$

In order to reduce or minimize the effect of temperature variation on the mixer 82, it may be desired to enable the bias voltage to track (e.g., vary with, vary directly with) a common mode voltage 122 ($V_{CM}$) and/or a threshold voltage (VTH). Accordingly, the disclosed embodiments include the replica mixer circuit 102 and the temperature compensation circuit 104 implemented to reduce the IIP2 variation of the mixer 82. That is, the replica mixer circuit 102 may generate or enable generation of a reference voltage 124 ($V_{REF}$), which may track the common mode voltage 122 ($V_{CM}$) and/or the threshold voltage (VTH) of a replica mixer 123 (e.g., a replica of one of the transistors 106 of the mixer 82). The reference voltage 124 may then be applied to the resistor ladder 116 to adjust the threshold voltage and/or the bias voltage 120 to compensate for temperature variation. Additionally, the temperature compensation circuit 104 may generate a temperature coefficient that may be applied to a current 126 ($I_{out}$) going through the calibration circuit 100 to enable determination of a mismatch variation percentage across temperature and compensation for the temperature variation. It should be understood that while the illustrated replica mixer 123 replicates one transistor (e.g., 106A), in additional or alternative embodiments, the mixer 82 may include multiple replica mixers 123 to replicate multiple transistors (including 106B, 106C, and/or 106D). Additional detail regarding the replica mixer circuit 102 and the temperature compensation circuit 104 will be discussed below.

A gate of the replica mixer 123 may be coupled to an output of a first voltage buffer 128 (e.g., an operational amplifier, a voltage follower) in a feedback loop. Moreover, a drain of the replica mixer 123 may be coupled to the power supply voltage 119 and a source of the replica mixer 123 may be coupled to an input of a current source 132 ($I_0$) and an inverting input terminal (e.g., a negative terminal) of the first voltage buffer 128 at a node 130. An output of the current source 132 may be coupled to ground 134. The first voltage buffer 128 may include a non-inverting input terminal (e.g., a positive terminal) coupled to the common mode voltage source and the inverting input terminal. The output voltage of the first voltage buffer 128 may be equal (or approximately equal) to the input voltage of the first voltage buffer 128. Thus, the output voltage of the first voltage buffer 128 may be equal to the received common mode voltage (e.g., the input voltage). The common mode voltage 122 may be then be provided as the source voltage for the replica mixer 123. Turning on the replica mixer 123 may include driving the replica mixer 123 into a saturation region by providing a gate (or gate-to-source) voltage 136 ($V_G$) of at least a threshold voltage level. The gate voltage 136 may be equal to a sum of the common mode voltage 122, the threshold voltage of the replica mixer 123, and an overdrive or offset voltage ($V_{OD}$). As an example, Equation 2 is shown below:

$$V_G = V_{CM} + V_{TH} + V_{OD} \qquad \text{(Equation 2)}$$

A gate of the replica mixer 123 may be coupled to an inverting input terminal (e.g., a negative terminal) of a second voltage buffer 138 (e.g., an operational amplifier, a voltage follower). The second voltage buffer 138 may also include a non-inverting input terminal (e.g., a positive terminal) coupled to its output via a transistor 140. The gate voltage 136 may be output by the replica mixer 123 and input to the second voltage buffer 138 via the inverting input terminal. The output voltage of the second voltage buffer 138 may be coupled to a gate of the transistor 140. The output voltage may be equal (or approximately equal) to the input voltage of the second voltage buffer 138. Thus, the second voltage buffer 138 may receive the gate voltage 136 from the replica mixer 123 and may provide (e.g., output) the reference voltage 124 to the transistor 140. The transistor 140 may have a source coupled to the power supply voltage 119 and a drain coupled to the calibration circuit 100 at a node 142. The reference voltage 124 may have a one-to-one relationship (e.g., be proportional) to the gate voltage 136. Further, the reference voltage 124 may also be equal to the sum of the common mode voltage 122, the threshold voltage of the replica mixer 123, and the overdrive or offset voltage ($V_{OD}$). As an example, Equation 3 is shown below:

$$V_{REF} = V_{CM} + V_{TH} + V_{OD} \qquad \text{(Equation 3)}$$

As observed in Equation 3, the reference voltage 124 may track the common mode voltage 122 and the threshold voltage of the replica mixer 123. That is, a change in the common mode voltage 122 and/or the threshold voltage may correspond to a change in the reference voltage 124. Further, as described above the bias voltage 120 may be applied to the mixer 82 to reduce or minimize the threshold mismatch. The bias voltage 120 may be related to the reference voltage 124, as shown in Equation 4 below:

$$V_B = V_{REF} - I_{out} * R \qquad \text{(Equation 4)}$$

Compensation for temperature variation may be improved by enabling the bias voltage 120 to track the common mode voltage 122 and/or the voltage threshold. Thus, enabling the reference voltage 124 to track the common mode voltage and/or the voltage threshold may enable the bias voltage 120 to be more accurately adjusted through the relationship shown in Equation 4 above. The reference voltage 124 may then be applied to the resistor ladder to adjust the bias voltage 120 and compensate for temperature variations. In this manner, the threshold mismatch may be minimized.

As stated above, the threshold mismatch may change at various temperatures. Thus, it may be desired to determine an amount or percentage of the threshold mismatch at different or various temperatures. As described above, the disclosed embodiments may include the temperature compensation circuit 104, which may generate a temperature coefficient that may be applied to the current 126 ($I_{out}$) in the calibration circuit 100 to enable determination of the mismatch variation percentage across temperature and facilitate compensation for the temperature variation. The mismatch variation percentage may enable determination, adjustment, and/or generation of the current 126 in the calibration circuit 100. A voltage delta (e.g., difference) for the bias voltage 120 from the resistor ladder 116 due to variation (e.g., temperature variation) may be represented as shown in Equation 5 below:

$$\Delta V_b = I_{out} * \Delta R \qquad \text{(Equation 5)}$$

The disclosed embodiments may also enable the voltage delta to compensate for the mismatch variation by selecting the current 126 ($I_{out}$) (e.g., by the temperature compensation circuit 104, the mixer 82, the processor 12, and so on). As an example, the threshold mismatch may be a difference between a positive bias voltage 146 ($V_{bp}$) and a negative bias voltage 148 ($V_{bn}$). The positive bias voltage 146 and the negative bias voltage 148 may be selected such that the difference (e.g., the threshold mismatch) is 10 millivolts. For example, the mismatch variation percentage may be determined to be equal to 10% at a low temperature and −10% at a high temperature. Thus, the current 126 may be selected such that at the low temperature the mismatch variation percentage is not higher than 10% and at high temperature the mismatch variation percentage is not lower than−10%. Additional details regarding the temperature compensation circuit 104 will be discussed below.

A gate of the transistor 118 of the calibration circuit 102 may be coupled to a gate and a drain of a transistor 150 of the temperature compensation circuit 104 via a node 152. A source of the transistor 150 may be coupled to ground 154. The temperature compensation circuit 104 may include a bias current source 144 ($I_b$), an up current source 156 ($I_{up}$), and a down current source 158 ($I_{down}$) coupled to the gate of the transistor 150 and the drain of the transistor 150 via the node 152. An input of the bias current source 144 and an input of the up current source 156 may be coupled to the power supply voltage 119. An output of the up current source 156, an input of the down current source 158, an output of the bias current source 144, the drain of the transistor 150, and the gate of the transistor 150 may be coupled together via the node 160. An output of the down current source 158 may be coupled to ground 164. The current 126 in the calibration circuit 100 may be expressed as shown in Equation 6 below:

$$I_{out} = I_b + I_{up} - I_{dn} \quad \text{(Equation 6)}$$

In Equation 6, the up current source 156 and the down current source 158 may be set to be proportional to an absolute temperature (PTAT) current source ($I_{ptat}$), an inversely proportional to absolute temperature (NTAT) current source ($I_{ntat}$), or a constant current source ($I_{const}$). The up current source 156 and the down current source 158 may be chosen to be equal (and to carry ($k*I_b$)) at room temperature, such that the current 126 may be determined by the bias current source 144. Thus, due to subtraction, two types of currents of the PTAT current source, the NTAT current source, and/or the constant current source may be utilized to implement three types of output currents (e.g., the PTAT current source, the NTAT current source, and the constant current source). Moreover, the bias current source 144 (or the bias current source 144 and the up current source 156, or the bias current source 144 and the down current source 158) may be made to be the PTAT current source, the NTAT current source, or the constant current source, but the mismatch variation percentage may be pre-designed. Additional detail regarding this implementation will be described below.

In a first case, such as when the mismatch variation percentage increases with an increasing temperature, it may be desired to apply the PTAT current source to the resistor ladder 116. For example, if the mismatch variation percentage becomes 10% higher at the high temperature, and −10% at the low temperature, then the current 126 may be equal to the PTAT current source, such that a higher voltage delta may be generated at the higher temperature. Accordingly, the bias current source 144 may be a selected constant value, the up current source 156 may be set to be proportional to the PTAT current source and the down current source 158 may be set to the constant current source. Because the bias current source 144 and the down current source 158 are constant, the current 126 in the calibration circuit 100 and being applied to the resistor ladder 116 may be equal to the PTAT current source. As an example, Equation 7 is shown below, where $T_0$ is an initial temperature, $\Delta T$ is a change in temperature (a difference between the current temperature and the initial temperature), and k is a coefficient (e.g., a factor) used to adjust or calibrate the current measurement:

$$I_{up} = I_{ptat}, I_{dn} = I_{const} \rightarrow I_{out} = I_b + k*I_b*\frac{\Delta T}{T_0} \quad \text{(Equation 7)}$$

In a second case, such as when the mismatch variation percentage is decreasing with the increasing temperature, it may be desired to apply the NTAT current source to the resistor ladder 116. Accordingly, the bias current source 144 may be the selected constant value, the up current source 156 may be set to the constant current source, and the down current source 158 may be set to be proportional to the PTAT current source. Because the bias current source 144 and the up current source 156 are constant, the current 126 going through the calibration circuit 100 and being applied to the resistor ladder 116 may be equal to the NTAT current source. As an example, Equation 8 is shown below:

$$I_{up} = I_{const}, I_{dn} = I_{ptat} \rightarrow I_{out} = I_b + k*I_b*\frac{\Delta T}{T_0} \quad \text{(Equation 8)}$$

In this manner, the up current source 156 and the down current source 158 may be chosen such that the current 126 going through the calibration circuit 100 may track the mismatch variation percentage. That is, the current 126 may vary at different temperatures, thus selecting the up current source 156 and/or the down current source 158 may enable compensation for the current 126 going through the calibration circuit 100. Thus, the temperature compensation circuit 104 may be configured based on a known mismatch variation percentage such that, when the mixer 82 experiences the mismatch, then the temperature compensation circuit 104 may output the corresponding compensation current.

As described herein, calibrating the compensation value for mismatched transistors using the calibration circuit 100 may compensate for the temperature variations, but such calibration may include determining an analog-to-digital (ADC) output power of the second-order nonlinearity tones to select the compensation value (e.g., calibration codes). However, the second-order nonlinearity tones may have a power less than or equal to a noise floor, resulting in inaccurate measurement of tones. One approach to detect the ADC output power is to repeatedly measure it and use an average to improve a signal-to-noise ratio (SNR). An average of N times improves SNR by 10*log 10 (N); however, a prerequisite is to phase align each sample, which may be difficult.

Thus, the disclosed embodiments may include performing a single-point Fast Fourier Transform (FFT) (or complex downconversion with DC average) for a number of samples to obtain a transform for each of the number of samples, phase aligning a set of phases associated with each transform, and averaging each transform to generate an analog-to-digital converter (ADC) power value. Further, the disclosed embodiments may include generating a compensation value based on the analog-to-digital converter power value and applying the compensation value to the calibration circuit 100 of the mixer 82 to compensate for a second-order intermodulation product.

Figure 5:
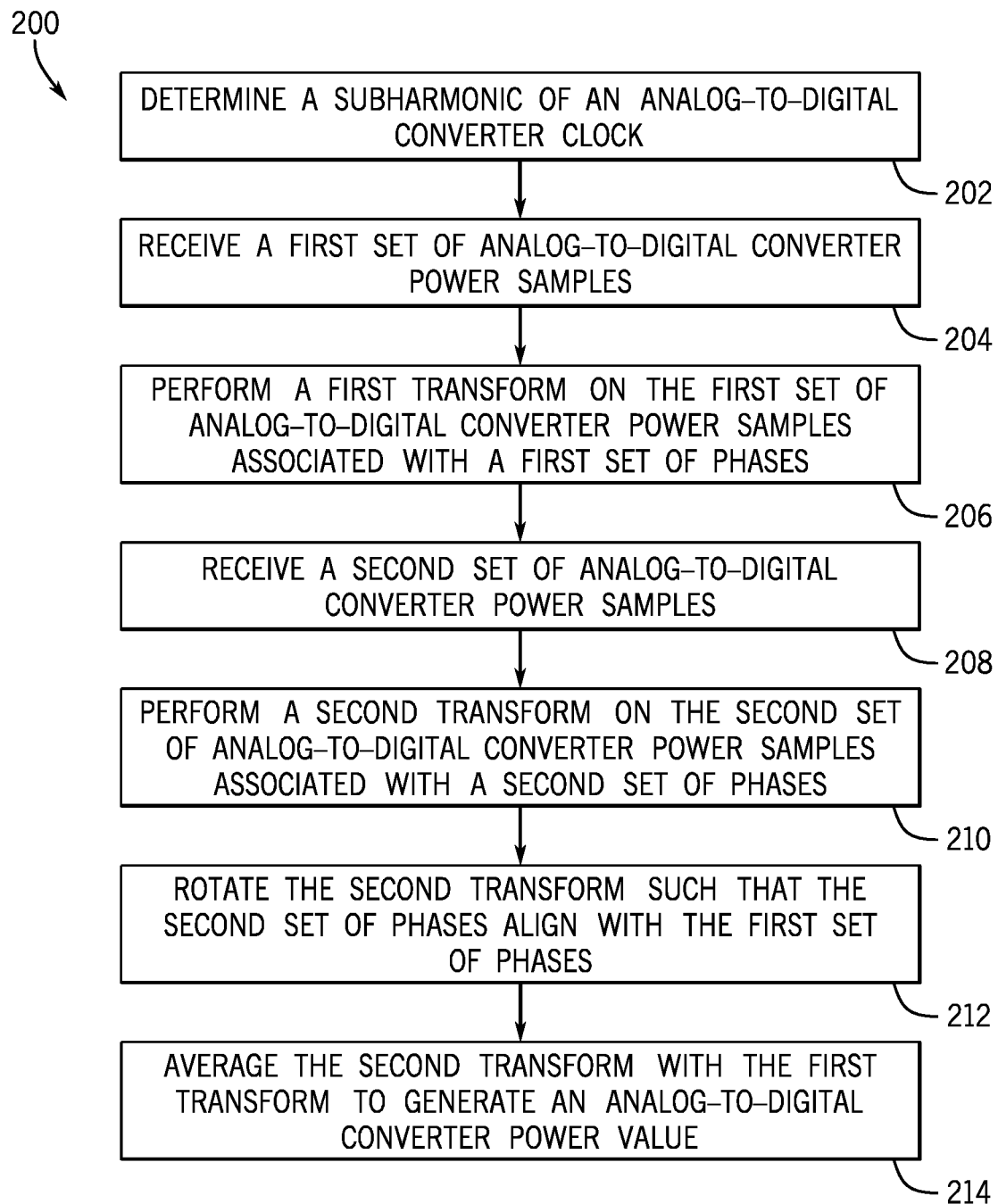
FIG. 5 is a flowchart of a process for determining an analog-to-digital converter (ADC) power value based on a first set of ADC power samples and a second set of ADC power samples to compensate for a second-order intermodulation product, according to embodiments of the present disclosure.

With the foregoing in mind, FIG. 5 is a flowchart of a process 200 for determining the (ADC) power value based on a first set of ADC power samples and a second set of ADC power samples to compensate for the second-order intermodulation product, according to embodiments of the present disclosure. Any suitable device (e.g., a controller) that may control components of the electronic device 10, such as the processor 12 or the transceiver 30, may perform the process 200. In some embodiments, the process 200 may be implemented by executing instructions stored in a tangible, non-transitory, computer-readable medium, such as the memory 14 or the storage 16, using the processor 12 or the transceiver 30. For example, the process 200 may be performed at least in part by one or more software components, such as an operating system of the electronic device 10, one or more software applications of the electronic device 10, and the like. While the process 200 is described using steps in a specific sequence, it should be understood that the present disclosure contemplates that the described steps may be performed in different sequences than the sequence illustrated, and certain described steps may be skipped or not performed altogether.

The single-point FFT may be determined by using Equation 9 shown below, where $IM2_{fft}$ is the FFT of the second-order intermodulation products, $f_0$ is the beat frequency, s (n) is a time-domain input signal at time index n, $T_s$ is a temperature, n is a number of iterations, and k is an index of a frequency component being calculated (as k increases, the frequency of the corresponding component increases as well):

$$IM2_{\mathit{fft}} = \sum_{n=1}^{k} s(n) * e^{-2\pi f_0 T_s n} \quad \text{(Equation 9)}$$

The beat frequency of the second-order intermodulation product may be received at the mixer 82. In some embodiments, the beat frequency may be predefined in the mixer 82. Thus, the beat frequency may be known to the processor 12. At process block 202, the processor 12 determines a subharmonic of an ADC clock. That is, the beat frequency ($f_0$) may be selected by the processor 12 to be the subharmonic of the ADC clock, where $f_0=f_s/M$ and M is the number of phases (e.g., phasors, number of sets of the ADC power samples), which results in Equation 10 shown below:

$$IM2_{\mathit{fft}} = \sum_{n=1}^{k} s(n) * e^{-\frac{j2\pi n}{M}} \quad \text{(Equation 10)}$$

At process block 204, the processor 12 receives a first set of ADC power samples. The first set of ADC power samples may include any suitable number of the ADC power samples. For example, a sample size may be equal to 512 samples. Using this sampling scheme, an improved signal-to-noise ratio (SNR) may be achieved. At process block 206, the processor 12 performs a first transform on the first set of ADC power samples associated with a first set of phases. That is, the processor 12 may perform Equation 10 using the first set of samples and determine the $IM2_{\mathit{fft}}$. Further, the processor 12 may determine the first set of phases associated with the first set of samples by performing Equation 11 shown below:

$$\text{Phase}_\phi = \arctan\left(\frac{\mathit{Imag}(IM2_{\mathit{fft}})}{\mathit{Real}(IM2_{\mathit{fft}})}\right) \quad \text{(Equation 11)}$$

At process block 208, the processor 12 receives a second set of ADC power samples. At process block 210, the processor 12 performs the second transform on the second set of ADC power samples associated with a second set of phases. As described above, the processor 12 may perform Equation 10 using the second set of samples and determine the $IM2_{\mathit{fft}}$. Further, the processor 12 may determine the second set of phases associated with the second set of samples by performing Equation 11 shown above.

At process block 212, the processor 12 rotates the second transform such that the second set of phases align with the first set of phases (to align with a previous sample). That is, the second transform may be rotated (e.g., phase-shifted, phase-aligned) by Equation 12 shown below:

$$\phi = \frac{2\pi k}{M} \quad \text{(Equation 12)}$$

Further, where k is in {1, 2, . . . , M}, a minimum index may be found by Equation 13 shown below:

$$\min\left|(\mathit{LIM2}_{\mathit{fft}1} - \mathit{LIM2}_{\mathit{fft}2}) - \frac{2\pi k}{M}\right| \quad \text{(Equation 13)}$$

At process block 214, the processor 12 averages (e.g., a phase-alignment average) the second transform with the first transform to generate an ADC power value. That is, the second transform and the first transform values are added together and then divided by two (for the number of samples) to obtain the average. It should be noted that although the process 200 is described with the first set of ADC power samples and the second set of ADC power samples, any suitable number of ADC power samples may be collected and averaged to generate the ADC power value. In this manner, accuracy in the generation of the ADC power value may be improved. Additional detail regarding providing the ADC power value will be provided below. A compensation value may then be generated based on the ADC power value and applied to the calibration circuit 100 of the mixer 82 to compensate for the second-order intermodulation product.

Figure 6:
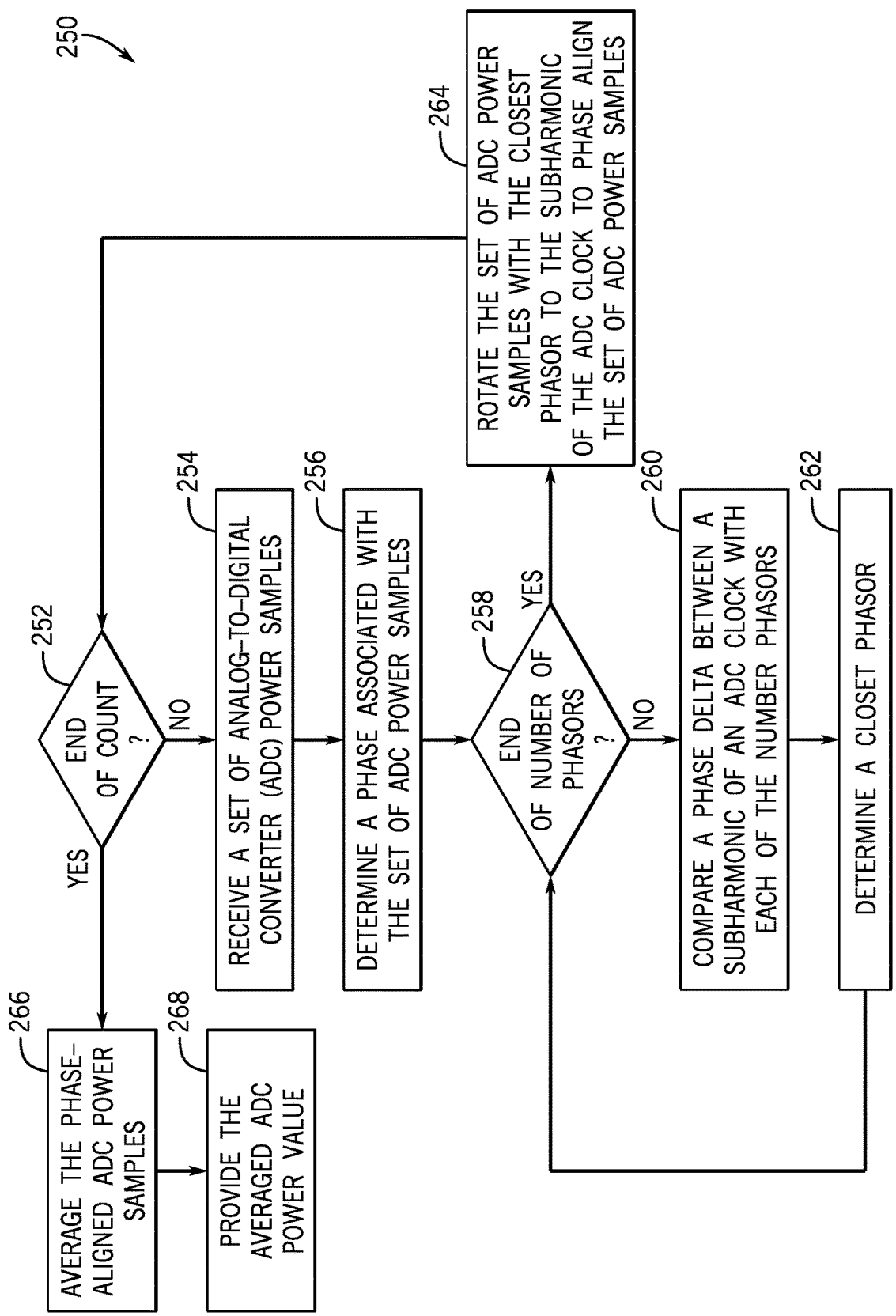
FIG. 6 is a flowchart of a process for determining the ADC power value based on iterating through multiple sets of ADC power samples to compensate for the second-order intermodulation product, according to embodiments of the present disclosure.

FIG. 6 is a flowchart of a process 250 for determining the ADC power value based on iterating through multiple sets of ADC power samples to compensate for the second-order intermodulation product, according to embodiments of the present disclosure. Any suitable device (e.g., a controller) that may control components of the electronic device 10, such as the processor 12 or the transceiver 30, may perform the process 250. In some embodiments, the process 250 may be implemented by executing instructions stored in a tangible, non-transitory, computer-readable medium, such as the memory 14 or the storage 16, using the processor 12 or the transceiver 30. For example, the process 250 may be performed at least in part by one or more software components, such as an operating system of the electronic device 10, one or more software applications of the electronic device 10, and the like. While the process 250 is described using steps in a specific sequence, it should be understood that the present disclosure contemplates that the described steps may be performed in different sequences than the sequence illustrated, and certain described steps may be skipped or not performed altogether.

At process block 252, the processor 12 determines whether a counting process has completed, which corresponds to a completion of phase-alignment for a designated number (e.g., a pre-defined number, a count) of ADC power samples (e.g., sets of ADC power samples). If the processor 12 determines the counting process is incomplete (e.g., at least one of the sets ADC power samples are unaligned), then the process 250 may proceed to process block 254. At process block 254, the processor 12 receives a set of ADC power samples. As described above, the processor 12 performs the single-point FFT on the set of ADC power samples to determine the $IM2_{\mathit{fft}}$. At process block 256, the processor 12 determines a phase (e.g., an initial phase) associated with the set of ADC power samples. That is, the processor 12 may determine the phase by using the $IM2_{\mathit{fft}}$ to perform Equation 11 shown above.

At process block 258, the processor 12 determines whether the determined phase concludes a list of the number of phasors. If the processor 12 determines phasors remain (e.g., additional phasors remain that have not been phase aligned) then the process 250 may proceed to process block 260. At process block 260, the processor 12 compares a phase delta (e.g., a phase difference) between the subharmonic of the ADC clock with each of the number of determined phasors. At process block 262, the processor 12 determines a closest phasor. That is, the processor 12 determines which of the number of phasors has the smallest phase delta and therefore is closest in value to the subharmonic of the ADC clock. The process 250 may then proceed to process block 258 to determine the closest phasor for each of the number of phasors. The process 250 may continuously iterate through process block 258, process block 260, and process block 262, until the processor 12 determines the phasors have ended.

Thus, with the foregoing in mind, and referring back to process block 258, if, at process block 258, the processor 12 determines phasors no longer remain (e.g., the list of the number of phasors has ended), then the process may proceed to process block 264. At process block 264, the processor 12 rotates the set of ADC power samples with the closest phasor to the subharmonic of the ADC clock to phase align the set of ADC power samples. As described herein, the ADC power samples may be rotated based on Equation 12 shown above.

The process 250 may then proceed to process block 252. At process block 252, the processor 12 determines whether the counting process is complete. If the processor 12 determines the completion of phase-alignment for the designated number of ADC power samples has been performed, the process 250 may proceed to process block 266. At process block 266, the processor 12 may average the phase-aligned ADC power samples. That is, the processor 12 may add each of the phase-aligned ADC power samples and then divide the summed value by the total number of phase-aligned ADC power samples. At process block 268, the processor 12 provides the averaged ADC power value (e.g., an averaged IM2 product). The processor 12 may then generate the compensation value based on the averaged ADC power value and apply the compensation value to the calibration circuit 100 of the mixer 20. Measuring the ADC power value in a tone power equal to or lower than a noise floor may be difficult. Accordingly, the disclosed embodiments enable performance of IIP2 calibration by determining the ADC power value with an improved accuracy. Determining the ADC power value with improved accuracy may also enable the processor 12 to drive a minimum search.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform] ing [a function] . . . " or "step for [perform] ing [a function] . . . ," it is intended that such elements are to be interpreted under 35 U.S.C. 112 (f). However, for any claims containing elements designated in any other manner, it is intended that such elements are not to be interpreted under 35 U.S.C. 112 (f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

An electronic device may include one or more antennas and a mixer coupled to the one or more antennas, the mixer including a plurality of transistors, a calibration circuit coupled to the plurality of transistors, a replica mixer circuit coupled to the calibration circuit, the replica mixer circuit including a first transistor and a first voltage buffer, and a temperature compensation circuit coupled to the calibration circuit.

The replica mixer circuit may include a second voltage buffer, the first transistor being coupled to the second voltage buffer and the first voltage buffer in a feedback loop.

A gate of the first transistor may be coupled to an output of the first voltage buffer, a drain of the first transistor may be coupled to a power supply, and a source of the first transistor may be coupled to a current source and the first voltage buffer.

A gate of a second transistor may be coupled to the second voltage buffer, a drain of the second transistor may be coupled to the calibration circuit, and a source of the second transistor may be coupled to a power supply.

The temperature compensation circuit may include a bias current source, an up current source, and a down current source.

The bias current source and the up current source may be coupled to a power supply.

The up current source, the down current source, the bias current source, a drain of the first transistor, and a gate of the first transistor may be coupled together.

A receiver may include a low noise amplifier; and a mixer coupled to the low noise amplifier, the mixer including a plurality of transistors and a calibration circuit coupled to the plurality of transistors, the calibration circuit configured to calibrate a common mode voltage, a threshold voltage, or both, of at least one transistor of the plurality of transistors, a replica mixer circuit coupled to the calibration circuit, the replica mixer circuit configured to generate a reference voltage to apply to the calibration circuit, a temperature compensation circuit coupled to the calibration circuit, the temperature compensation circuit configured to generate a temperature coefficient to apply to the calibration circuit The replica mixer circuit may include a first transistor, a first voltage buffer, and a second voltage buffer, the first transistor being coupled to the first voltage buffer in a feedback loop and the second voltage buffer.

The first voltage buffer may be configured to receive the common mode voltage from a common mode voltage source and provide the common mode voltage to the first transistor.

The first transistor may be configured to receive a gate-to-source voltage including a sum of the common mode voltage, the threshold voltage, and an overdrive voltage.

The second voltage buffer may be configured to receive the gate-to-source voltage from the first transistor and provide the reference voltage to a second transistor coupled to the calibration circuit.

The reference voltage may be proportional to the gate-to-source voltage.

The temperature compensation circuit may include an up current source and a down current source, the up current source and the down current source may each be configured to be proportional to a proportional to absolute temperature (PTAT) current source or proportional to an inversely proportional to absolute temperature (NTAT) current source.

The up current source may be configured to be proportional to the PTAT current source and the down current source may be configured to be proportional to a constant current source, and wherein the temperature compensation circuit may be configured to apply the up current source to a resistor ladder of the calibration circuit.

The up current source may be configured to be proportional to a constant current source and the down current source may be configured to be proportional to the PTAT current source, and wherein the temperature compensation circuit may be configured to apply the down current source to a resistor ladder of the calibration circuit.

A mixer may include a plurality of transistors, a calibration circuit coupled to the plurality of transistors, the calibration circuit configured to calibrate a common mode voltage, a threshold voltage, or both, of at least one transistor of the plurality of transistors, and a replica mixer circuit coupled to the calibration circuit, the replica mixer circuit configured to generate a reference voltage to apply to the calibration circuit that varies with temperature.

The reference voltage may vary with the common mode voltage, the threshold voltage, or both.

The calibration circuit may be configured to generate a bias voltage based on the reference voltage and apply the bias voltage to the mixer.

A temperature compensation circuit may be coupled to the calibration circuit, the temperature compensation circuit configured to generate a temperature coefficient to apply to a current in the calibration circuit based on a mismatch variation percentage.

The invention claimed is:

1. An electronic device, comprising:
a receiver comprising a mixer and an analog-to-digital converter (ADC), the mixer comprising a calibration circuit; and
one or more processors coupled to the receiver, the one or more processors configured to
receive a first set of ADC power samples from the ADC,
perform a first transform on the first set of ADC power samples associated with a first set of phases,
receive a second set of ADC power samples from the ADC,
perform a second transform on the second set of ADC power samples associated with a second set of phases, and
apply a compensation value based on the first transform and the second transform to the calibration circuit of the mixer to compensate for a second-order intermodulation product.

2. The electronic device of claim 1, wherein the one or more processors are configured to receive a subharmonic of an ADC clock.

3. The electronic device of claim 2, wherein the one or more processors are configured to receive a closest phasor between the first set of phases and the second set of phases.

4. The electronic device of claim 3, wherein the one or more processors are configured to rotate the second transform based on the closest phasor to the subharmonic of the ADC clock.

5. The electronic device of claim 1, wherein the first transform and the second transform comprise a Fast Fourier Transform (FFT).

6. The electronic device of claim 1, wherein the one or more processors are configured to receive a beat frequency of the second-order intermodulation product at the mixer.

7. The electronic device of claim 6, wherein the one or more processors are configured to receive a subharmonic of an ADC clock that corresponds to the beat frequency.

8. The electronic device of claim 1, wherein the one or more processors are configured to rotate the second transform to align the second set of phases and the first set of phases.

9. A method comprising:
receiving, via processing circuitry, a set of analog-to-digital converter (ADC) power samples at a mixer;
receiving, via the processing circuitry, a set of phases associated with the set of ADC power samples;
receiving, via the processing circuitry, a closest phasor based on a subharmonic of an ADC clock and the set of phases; and
generating, via the processing circuitry, a compensation value based on the set of ADC power samples and the closest phasor; and
applying, via the processing circuitry, the compensation value to a calibration circuit of the mixer.

10. The method of claim 9, wherein generating, via the processing circuitry, the compensation value comprises averaging, via the processing circuitry, the set of ADC power samples.

11. The method of claim 9, comprising receiving, via the processing circuitry, a beat frequency of a second-order intermodulation product at the mixer.

12. The method of claim 11, comprising receiving, via the processing circuitry, the subharmonic of the ADC clock, the subharmonic of the ADC clock corresponding to the beat frequency.

13. The method of claim 9, wherein the closest phasor comprises a phasor of a set of phasors associated with the set of phases that is closest to the subharmonic of the ADC clock.

14. The method of claim 9, comprising determining, via the processing circuitry, a phasor of a set of phasors associated with the set of phases that is unaligned.

15. The method of claim 9, comprising determining, via the processing circuitry, whether sets of ADC power samples are phase-aligned.

16. The method of claim 15, comprising receiving, via the processing circuitry, an additional set of ADC power samples at the mixer based on at least one of the sets of ADC power samples being unaligned.

17. One or more non-transitory, tangible, computer-readable media that store instructions configured to cause a processor to:
receive a beat frequency of a second-order intermodulation product;
receive a subharmonic of an analog-to-digital converter (ADC) clock that corresponds to the beat frequency;
receive a first set of ADC power samples;
perform a first transform on the first set of ADC power samples;
receive a first set of phases associated with the first set of ADC power samples;
receive a second set of ADC power samples;
perform a second transform on the second set of ADC power samples;
receive a second set of phases associated with the second set of ADC power samples;
rotate the second transform to align the second set of phases and the first set of phases; and
generate an ADC power value based on the first transform and the second transform as rotated.

18. The one or more non-transitory, tangible, computer-readable media of claim 17, wherein the instructions are configured to cause the processor to generate the ADC power value by averaging the first transform with the second transform as rotated.

19. The one or more non-transitory, tangible, computer-readable media of claim 17, wherein the instructions are configured to cause the processor to generate a compensation value based on the ADC power value.

20. The one or more non-transitory, tangible, computer-readable media of claim 19, wherein the instructions are configured to cause the processor to apply the compensation value to a calibration circuit of a mixer to compensate for the second-order intermodulation product.

\* \* \* \* \*